US009566765B2

(12) United States Patent
Devisetti

(10) Patent No.: US 9,566,765 B2
(45) Date of Patent: Feb. 14, 2017

(54) RADIATION CURABLE ADHESIVES FOR REFLECTIVE LAMINATED SOLAR PANELS, LAMINATED SOLAR PANELS INCLUDING RADIATION CURABLE ADHESIVES, AND/OR ASSOCIATED METHODS

(75) Inventor: Suresh K. Devisetti, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1562 days.

(21) Appl. No.: 13/168,128

(22) Filed: Jun. 24, 2011

(65) Prior Publication Data

US 2012/0087030 A1    Apr. 12, 2012

Related U.S. Application Data

(63) Continuation-in-part of application No. 12/923,836, filed on Oct. 8, 2010.

(51) Int. Cl.
*G02B 5/08* (2006.01)
*B32B 17/10* (2006.01)
*B32B 37/12* (2006.01)
*B32B 37/06* (2006.01)
*F24J 2/10* (2006.01)
*F24J 2/46* (2006.01)

(52) U.S. Cl.
CPC ..... *B32B 17/10036* (2013.01); *B32B 17/1022* (2013.01); *B32B 17/10183* (2013.01); *B32B 17/10706* (2013.01); *B32B 17/10743* (2013.01); *B32B 37/06* (2013.01); *B32B 37/12* (2013.01); *F24J 2/1057* (2013.01); *G02B 5/0816* (2013.01); *G02B 5/0875* (2013.01); *F24J 2002/4676* (2013.01); *Y02E 10/40* (2013.01)

(58) Field of Classification Search
CPC .......... G02B 5/0816; G02B 5/0875; B32B 17/10036; B32B 17/1022; B32B 17/10706; B32B 37/06; B32B 37/12; B32B 37/14
USPC ........... 156/101, 107, 273.3, 275.5, 106, 99; 359/883, 900; 427/165
See application file for complete search history.

(56) References Cited

U.S. PATENT DOCUMENTS

| 4,511,618 | A |  | 4/1985 | Duchene et al. |
| 5,030,594 | A |  | 7/1991 | Heithoff |
| 5,149,592 | A | * | 9/1992 | Wojnarowicz ............... 428/447 |
| 5,219,712 | A | * | 6/1993 | Evans et al. ................. 430/311 |
| 5,942,062 | A |  | 8/1999 | Hassall et al. |
| 6,689,458 | B1 |  | 2/2004 | Mikoshiba et al. |
| 6,853,394 | B2 |  | 2/2005 | Taylor et al. |

(Continued)

FOREIGN PATENT DOCUMENTS

| EP | 2 206 991 | 7/2010 |
| GB | 2 015 427 | 9/1979 |
| WO | WO 2007/108861 | 9/2007 |
| WO | WO 2010/042311 | 5/2010 |

(Continued)

Primary Examiner — Ricky D Shafer
(74) Attorney, Agent, or Firm — Nixon & Vanderhye P.C.

(57) ABSTRACT

Certain example embodiments relate to techniques for creating flat laminated mirrors, e.g., for use in concentrating solar power (CSP) applications. In certain example embodiments, the first substrate is a low iron glass substrate. A reflective coating is provided between the first and second substrates. The first and second substrates are laminated together via a radiation curable laminating adhesive with the reflective coating between the substrates. In certain example embodiments the radiation curable laminating adhesive is cured via UV radiation in order to form a laminated reflective article.

19 Claims, 6 Drawing Sheets

(56) References Cited

U.S. PATENT DOCUMENTS

| | | | |
|---|---|---|---|
| 7,557,053 B2 | 7/2009 | Thomsen et al. | |
| 7,625,627 B2 | 12/2009 | Smith et al. | |
| 7,700,870 B2 | 4/2010 | Thomsen et al. | |
| 7,871,664 B2* | 1/2011 | O'Connor et al. | 427/162 |
| 8,303,124 B2* | 11/2012 | O'Connor et al. | 359/853 |
| 8,702,253 B2* | 4/2014 | Lu et al. | 359/871 |
| 8,833,950 B2* | 9/2014 | Lu et al. | 359/883 |
| 2005/0068629 A1* | 3/2005 | Fernando et al. | 359/609 |
| 2006/0169316 A1 | 8/2006 | Thomsen et al. | |
| 2006/0249199 A1 | 11/2006 | Thomsen et al. | |
| 2006/0287408 A1* | 12/2006 | Baikerikar et al. | 522/71 |
| 2007/0215205 A1 | 9/2007 | Thomsen et al. | |
| 2007/0223096 A1 | 9/2007 | O'Connor et al. | |
| 2008/0210303 A1* | 9/2008 | Lu et al. | 136/260 |
| 2008/0274394 A1* | 11/2008 | Schormann et al. | 429/50 |
| 2009/0101208 A1 | 4/2009 | Vandal et al. | |
| 2009/0217978 A1 | 9/2009 | Thomsen et al. | |
| 2009/0223252 A1 | 9/2009 | Fulton et al. | |
| 2009/0297806 A1* | 12/2009 | Dawson-Elli et al. | 428/213 |
| 2010/0051193 A1* | 3/2010 | Stewart et al. | 156/275.5 |
| 2010/0122728 A1 | 5/2010 | Fulton et al. | |
| 2010/0154477 A1 | 6/2010 | Thomsen et al. | |
| 2010/0236089 A1* | 9/2010 | Kawasaki et al. | 34/275 |
| 2010/0255980 A1 | 10/2010 | Fulton et al. | |
| 2012/0074450 A1* | 3/2012 | Sakurai et al. | 257/98 |
| 2012/0087029 A1* | 4/2012 | Vandal et al. | 359/883 |

FOREIGN PATENT DOCUMENTS

| | | |
|---|---|---|
| WO | WO 2011/090469 | 7/2011 |
| WO | WO 2011/090764 | 7/2011 |
| WO | WO 2012/047248 | 4/2012 |

* cited by examiner

RADIATION CURABLE ADHESIVES FOR REFLECTIVE LAMINATED SOLAR PANELS, LAMINATED SOLAR PANELS INCLUDING RADIATION CURABLE ADHESIVES, AND/OR ASSOCIATED METHODS

This application is a continuation-in-part of U.S. application Ser. No. 12/923,836, filed Oct. 8, 2010, the disclosure of which is incorporated herein by reference.

FIELD OF THE INVENTION

Certain example embodiments of this invention relate to improved mirrors and/or reflective articles, and/or methods of making the same. More particularly, certain example embodiments relate to techniques for creating flat laminated mirrors using radiation curable laminating adhesives, e.g., for use in concentrating solar power (CSP) or concentrating photovoltaic (CPV) applications.

BACKGROUND AND SUMMARY OF EXAMPLE EMBODIMENTS OF THE INVENTION

The energy needs of society are constantly growing. Techniques to meet this growing energy demand are continually sought after. One area of focus has been in the area of solar power. Solar power technology can take various forms. One technique is to use photovoltaic technology to convert light into electrical current. Another technique is called concentrating solar power or CSP.

Generally speaking, CSP uses mirrors to focus the radiation from the sun into a small area. This small area may be, for instance, a tower in the middle of a field of mirrors. The concentrated heat formed at the focal point (e.g., at the tower) may then be used to as a heat source in a conventional power plant (e.g., to run a turbine that creates electrical current), or for any other thermal application such as, for example, sea water desalination. Concentrated energy from mirrors may also be used to focus on photovoltaic cells to potentially increase their output.

Various types of mirrors may be used in CSP applications. Parabolic mirrors, for instance, are structured to focus a broad beam of light (e.g., light from the sun) into a single point. However, parabolic mirrors can be difficult and/or expensive to produce and maintain. Another type of mirror that may be used in CSP applications is a flat mirror. These mirrors sometimes have an advantage of being cheaper and easier to maintain than their parabolic counterparts.

The overall efficiency of a CSP application may relate to how efficiently the power plant captures the energy from the sun's radiation. One technique to improve the efficiency CSP applications may be to employ tracking technology that facilitates optimal positioning of the CSP mirrors in relation to the position of the sun in the sky (e.g., the mirrors may track the sun as the sun progress across the sky).

Another factor in the efficiency of CSP applications may be the reflective efficiency of the mirrors. Mirrors with higher reflectance rates will increase the overall efficiency of CSP applications. Accordingly, high reflectance mirrors are continually sought after in order to improve the efficiency of CSP applications.

One challenge lies in how to protect these mirrors from the environments in which they are located, which often are quite harsh. Indeed, it will be appreciated that CSP applications may be placed in harsh environments that may be subject to high wind loads and/or other conditions. A large piece of glass exposed to high winds may have a large amount of force directed to the exposed surface area of the glass substrate. The strength of the glass has been found to be generally proportional to the square of its thickness. Accordingly, if the wind force applied to the surface of the glass exceeds the structural strength of the glass the glass (and mirror) may break.

A broken mirror may have several additional negative consequences. First, the broken glass of the mirror may present a safety hazard to people working with the mirror (e.g., because of the shards of glass). Second, a painted backing layer may contain a certain percentage of lead in it. This lead concentration may make disposal of the now-broken mirror a hazardous process. Third, as the structural integrity for the mirror as a whole may be substantially dependent on the structural integrity of the glass substrate, a loss in the glass substrate's structural integrity (e.g., because of breaking) may be substantially carried over to the mirror as a whole. Thus, when a glass substrate breaks, the entire glass surface may be completely destroyed and potentially resulting in a complete loss of the mirror and its reflective functionality.

Thus, it will be appreciated the structural strength of the mirror may need to be sufficient to prevent breakage, especially in high wind environments.

To overcome structural stability issues, some mirrors have sometimes included relatively thick glass substrates. Unfortunately, however, the use of thicker glass substrates can negatively affect the performance of the mirror, e.g., as a result of higher absorption, reduced reflectance from the mirror, etc. Even very high transmission glass likely will not transmit 100% of the light impinging on it. Thus, some light will not reach the mirror coating on the back side of the glass, and some of the light reflected from the mirror coating on the back side of the glass will not be transmitted back out of the glass. Thus, increasing the thickness of the glass used on the mirror may lead to reduced reflectance rates and, ultimately, reduced efficiency in CSP applications. Additionally, the conventional technique of increasing the structural strength in mirrors by increasing the thickness of the glass substrate also increases the cost of entire assembly, e.g., as a result of high material costs because high transmission low iron solar glass types are typically of higher cost than regular glass.

One or more layers of paint may be provided to conventional mirrors, e.g., to help protect the layered coating from the environment. Unfortunately, however, the applied paint may still be susceptible to UV radiation. Accordingly, in order to protect the paint from UV radiation the thickness of the silver coating in the layered coating may be increased in order to provide sufficient protection. As will be appreciated, this extra thickness of silver may further increase the cost of a mirror.

Thus, it will be appreciated that techniques for increasing (or maintaining) the durability of mirrors in CSP application while also maintaining (or increasing) a mirrors reflectance percentage are continuously sought after. It also will be appreciated that there exists a need in the art for improved mirrors and the like that, for example, can be used in CSP applications.

Certain example embodiments of this invention relate to a method of making an article. A first low-iron glass substrate is provided, with the first substrate having a thickness of about 0.5-3 mm. A reflective coating is disposed on a major surface of the first substrate. A radiation curable laminating adhesive is disposed over the reflective coating. A second glass substrate is provided substantially parallel to the first substrate, with the second substrate being oriented over the radiation curable laminating adhesive. The substrates is irradiated such that radiation causes the adhesive to become a solid polymer interlayer to laminate together the first substrate with the reflective coating disposed thereon and the second substrate to form a reflective article. The reflective article has a reflectivity of at least 90 percent.

Certain example embodiments of this invention relate to a method of making an article. A first low-iron glass substrate is provided, with the first substrate having a thickness of about 0.5-3 mm. A multi-layer thin-film reflective coating is disposed on a major surface of the first substrate. The reflective coating comprises, in order moving away from the substrate, a tin-inclusive layer, an Ag-inclusive layer directly contacting the tin-inclusive layer, and a copper-inclusive layer directly contacting the Ag-inclusive layer. A radiation curable laminating adhesive is disposed over the reflective coating. A second glass substrate is substantially parallel to the first substrate, with the second substrate being oriented over the laminating adhesive, and with the second substrate being at least as thick as the first substrate. The second substrate has an iron content higher than an iron content of the first substrate. The first substrate with the reflective coating disposed thereon and the second substrate are laminated together to form a reflective article by irradiating the substrates with UV radiation such that the radiation curable laminating adhesive is cured to form a solid polymer interlayer.

Certain example embodiments of this invention relate to a coated article. A first low-iron glass substrate has a thickness of 0.5-3 mm. A reflective coating comprises a plurality of thin film layers disposed on a major surface of the first substrate. A second substrate is substantially parallel to the first high transmission substrate, with the second substrate having a higher iron content than the first substrate and being at least twice as thick as the first substrate. The first and second substrates are laminated together with a radiation cured polymer interlayer. The polymer interlayer hermetically seals the reflective coating between the first and second substrates. The reflective article has a reflectivity above 90 percent.

The features, aspects, advantages, and example embodiments described herein may be combined in any suitable combination or sub-combination to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments may relate to mirrors comprising two glass substrates, a mirror coating, and a laminate.

High reflectance rates in mirrors may sometimes be achieved by using a high transmission glass substrate. Mirrors using high transmission glass in CSP applications may be constructed as follows. A glass substrate of about 4 mm may be first prepared (e.g., polished) to remove debris, etc. The prepared glass substrate may be backed by a layered coating that may consist of or comprise tin (e.g., deposited or otherwise disposed from a tin chloride bath), silver, and copper. The coating may be backed by one or more painted layers, e.g., in order to help protect the coating from the environment (e.g., oxidization of the copper and/or silver) or other harms (scratches, etc). As is known, the painted layer may include a certain amount of lead. Furthermore, the UV radiation from the sun may penetrate the reflective coating and cause damage to the painted layer. This may result in a need to increase the silver layer of the mirror coating in order to provide better UV protection to the painted layer. Accordingly, mirrors for CSP applications produced as discussed above may be able to achieve reflectance rates of about 93%. As is known, however, the higher the desired transmission rate of a piece of glass, the more costly it may be. Thus, it will be appreciated that it would be desirable to achieve the benefits of high transmission glass at lower costs, e.g., while at least maintaining (and sometimes improving) structural stability.

The inclusion of a back glass substrate may be advantageous in certain example instances. For instance, in CSP or CPV desert installations, the nominally protective paint layer may be chipped or otherwise damaged by virtue of the harsh conditions (such as, for example, sand blasts from sand storms, high wind conditions, or the like). The inclusion of a back glass substrate in certain example embodiments may help reduce these and/or other concerns.

Figure 1:
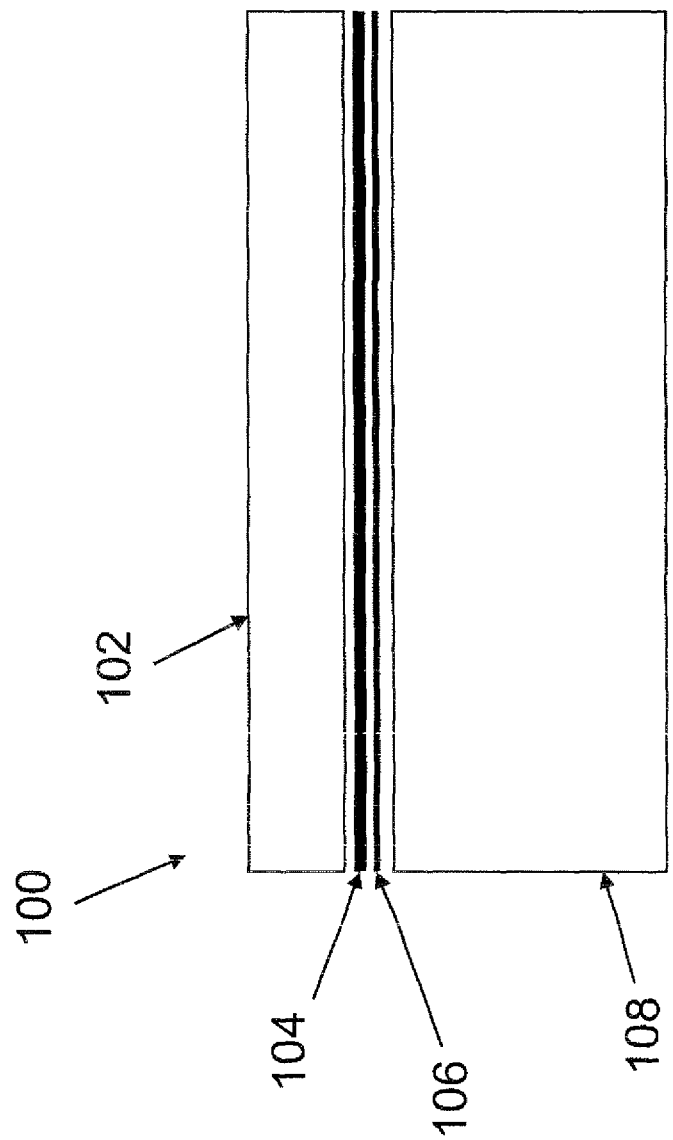
FIG. 1 is an illustrative cross-sectional view showing the components of an exemplary improved mirror in accordance with an example embodiment.

Referring now more particularly to the drawings in which like reference numerals indicate like parts throughout the several views, FIG. 1 is an illustrative cross-sectional view of an exemplary improved mirror in accordance with an example embodiment. An improved mirror 100 with a first glass substrate 102 may be provided.

A second glass substrate 108 may be provided at the rear of the improved mirror 100 (e.g., opposite the first glass substrate and where the sun hits the mirror). A reflective coating (described in greater detail below) 104 may be disposed (e.g., deposited) between the first glass substrate and the second glass substrate. Also disposed (e.g., deposited) between the first glass substrate and the second glass substrate may be a laminate 106. As discussed below, laminate 106 may act to bond the two glass substrates together. Once the glass substrates have been bonded, they may provide protection from the elements for the reflective coating 104.

The first glass substrate 102 may be composed of low iron/high transmission glass. As discussed above, it may be desirable to use high transmission glass to improve the overall reflectivity percentage of the mirror. One technique of producing high transmission glass is by producing low iron glass. See, for example, U.S. Pat. Nos. 7,700,870; 7,557,053; and 5,030,594, U.S. application Ser. No. 12/385,318, and U.S. Publication Nos. 2006/0169316; 2006/0249199; 2007/0215205; 2009/0223252; 2010/0122728; and 2009/0217978, the entire contents of each of which are hereby incorporated herein by reference.

An exemplary soda-lime-silica base glass according to certain embodiments of this invention, on a weight percentage basis, includes the following basic ingredients:

TABLE 1

EXAMPLE BASE GLASS

| Ingredient | Wt. % |
|---|---|
| $SiO_2$ | 67-75% |
| $Na_2O$ | 10-20% |
| CaO | 5-15% |
| MgO | 0-7% |
| $Al_2O_3$ | 0-5% |
| $K_2O$ | 0-5% |

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \times 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO.

In addition to the base glass (e.g., see Table 1 above), in making glass according to certain example embodiments of the instant invention the glass batch includes materials (including colorants and/or oxidizers) that cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., antimony and/or the like). In certain example embodiments of this invention, the resulting glass has visible transmission of at least 75%, more preferably at least 80%, even more preferably of at least 85%, and most preferably of at least about 90% (sometimes at least 91%) (Lt D65).

In certain embodiments of this invention, in addition to the base glass, the glass and/or glass batch comprises or consists essentially of materials as set forth in Table 2 below (in terms of weight percentage of the total glass composition):

TABLE 2

EXAMPLE ADDITIONAL MATERIALS IN GLASS

| Ingredient | General (Wt. %) | More Preferred | Most Preferred |
|---|---|---|---|
| total iron (expressed as $Fe_2O_3$) | 0.001-0.06% | 0.005-0.045% | 0.01-0.03% |
| % FeO | 0-0.0040% | 0-0.0030% | 0.001-0.0025% |
| glass redox (FeO/total iron) | <=0.10 | <=0.06 | <=0.04 |
| cerium oxide | 0-0.07% | 0-0.04% | 0-0.02% |
| antimony oxide | 0.01-1.0% | 0.01-0.5% | 0.1-0.3% |
| $SO_3$ | 0.1-1.0% | 0.2-0.6% | 0.25-0.5% |
| $TiO_2$ | 0-1.0% | 0.005-0.4% | 0.01-0.04% |

In certain example embodiments, the antimony may be added to the glass batch in the form of one or more of $Sb_2O_3$ and/or $NaSbO_3$. Note also $Sb(Sb_2O_5)$. The use of the term antimony oxide herein means antimony in any possible oxidation state, and is not intended to be limiting to any particular stoichiometry.

The low glass redox evidences the highly oxidized nature of the glass. Due to the antimony (Sb), the glass is oxidized to a very low ferrous content (% FeO) by combinational oxidation with antimony in the form of antimony trioxide ($Sb_2O_3$), sodium antimonite ($NaSbO_3$), sodium pyroantinionate ($Sb(Sb_2O_5)$), sodium or potassium nitrate and/or sodium sulfate. In certain example embodiments, the composition of the glass substrate includes at least twice as much antimony oxide as total iron oxide, by weight, more preferably at least about three times as much, and most preferably at least about four times as much antimony oxide as total iron oxide.

In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material.

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass that can sometimes be undesirable when seeking to achieve a neutral or clear color.

In view of the above, glasses according to certain example embodiments of this invention achieve a neutral or substantially clear color and/or high visible transmission. In certain embodiments, resulting glasses according to certain example embodiments of this invention may be characterized by one or more of the following transmissive optical or color characteristics when measured at a thickness of from about 1-6 mm (more preferably a thickness of about 3-4 mm; this is a non-limiting thickness used for purposes of reference only) (Lta is visible transmission %). It is noted that in the table below the a* and b* color values are determined per Ill. D65, 10 degree Obs.

TABLE 3

GLASS CHARACTERISTICS OF EXAMPLE EMBODIMENTS

| Characteristic | General | More Preferred | Most Preferred |
|---|---|---|---|
| Lta (Lt D65): | >=85% | >=90% | >=91% |
| % τe (ISO 9050): | >=85% | >=90% | >=91% |
| % FeO (wt. %): | <=0.004% | =0.003% | <=0.0020% |

TABLE 3-continued

GLASS CHARACTERISTICS OF EXAMPLE EMBODIMENTS

| Characteristic | General | More Preferred | Most Preferred |
|---|---|---|---|
| L* (Ill. D65, 10 deg.): | 90-99 | n/a | n/a |
| a* (Ill. D65, 10 deg.): | −1.0 to +1.0 | −0.5 to +0.5 | −0.2 to 0.0 |
| b* (Ill. D65, 10 deg.): | 0 to +1.5 | +0.1 to +1.0 | +0.2 to +0.7 |

First glass substrate 102, in addition to being composed of high transmission or low iron glass, may be thinner than is conventional for mirrors used in CSP applications. In certain example embodiments, the first glass substrate may be between 0.5 mm and 3 mm thick, more preferably between 1 mm and 2 mm thick, and most preferably between around 1.5 mm and 1.6 mm thick. The second substrate 108 may have a conventional or increased thickness, e.g., so as to help provide structural robustness for the overall mirror 100. Thus, in certain example instances, any structural rigidity "lost" by virtue of making the first substrate 102 thinner may be compensated for by providing a second substrate 108 at the same or increased thickness.

It will be appreciated that the transmission properties of the second glass substrate may not be a factor in the overall efficiency of the mirror. Accordingly, any type of glass may be used. For example, a soda lime float glass of any commercial grade or tint may be used. Further, while the first glass substrate 102 may be composed of low iron glass, the second glass substrate may be composed of high or higher iron glass. It will be appreciated that because the specific type of glass is not a factor in the production of improved mirror 100, any type of glass may be used (e.g., low cost glass) for the second glass substrate 108

Further, as the transmission properties of the second glass substrate 108 may not be a factor, as indicated above, the second glass substrate 108 may be applied in varying thickness to the back of the improved mirror 100. For example, in certain embodiments the thickness of the first glass substrate may be approximately 1.5 mm and the thickness of the second glass substrate may be approximately 5 mm. Once the bonding process between the two glass substrates is complete, the structural strength of the first glass substrate will be reinforced (e.g., added to) by the structural strength of the second glass substrate. Thus, the total structural strength of the above example embodiment may be approximately equal to a single glass substrate of around 6.5 mm in certain example instances.

Accordingly, a thin, high transmission glass substrate may be paired with a lower cost, thicker piece of glass to form an improved mirror with the structural strength sufficient to withstand the harsh environmental conditions that may accompany CSP applications In addition to contributing to the overall structural strength of the improved mirror 100, the second substrate 108 may provide additional integrity to the improved mirror 100. For example, if the front glass substrate 102 cracks or breaks, the bonded second glass substrate 108 may help provide structural integrity to the overall mirror so as to help hold the broken pieces of the front glass substrate in place 102, e.g., because the PTB helps hold the two substrates (including the broken pieces of glass) together. Accordingly, the improved mirror may continue to be functional with little or no loss in reflected energy. This may further allow personnel the time needed to replace the broke glass substrate. Removal may also be facilitated, e.g., by helping to maintain the shards in the overall assembly with the aid of the laminate and the second substrate 108.

Figure 2:
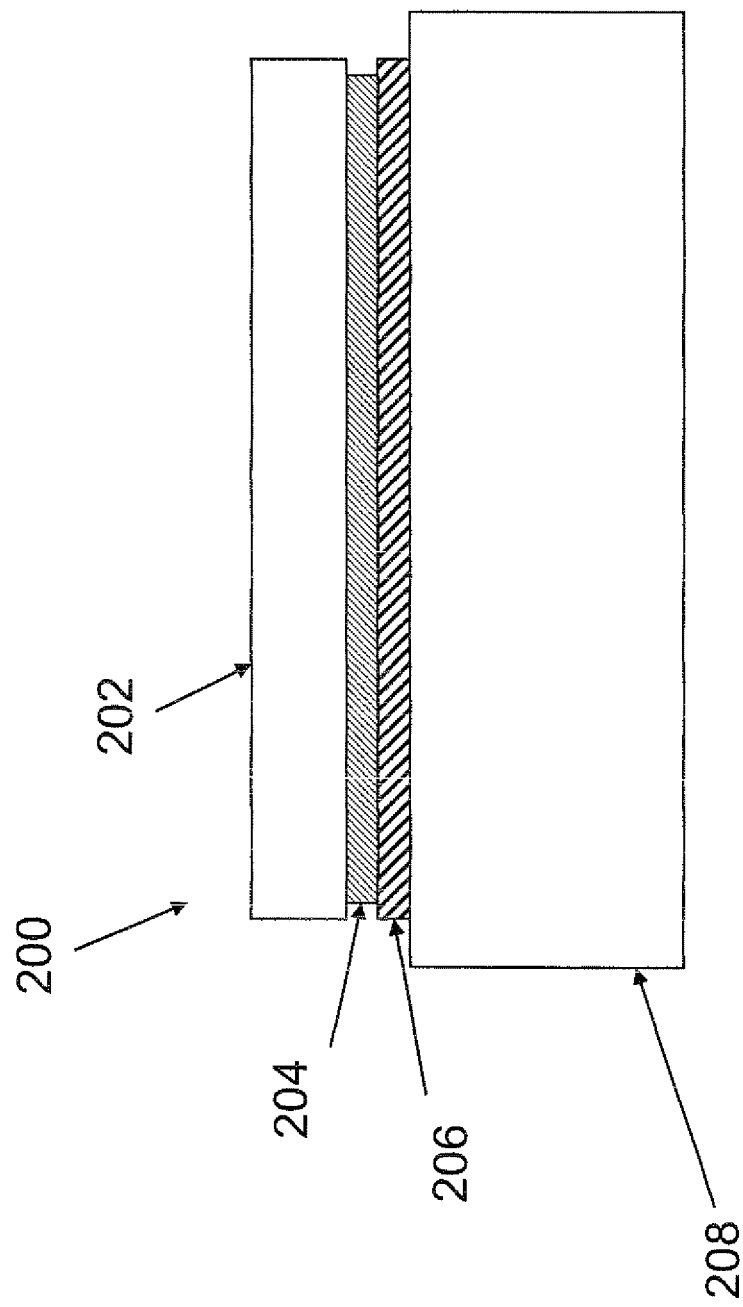
FIG. 2 is an illustrative cross-sectional view of an exemplary improved mirror in accordance with another example embodiment.
Figure 3:
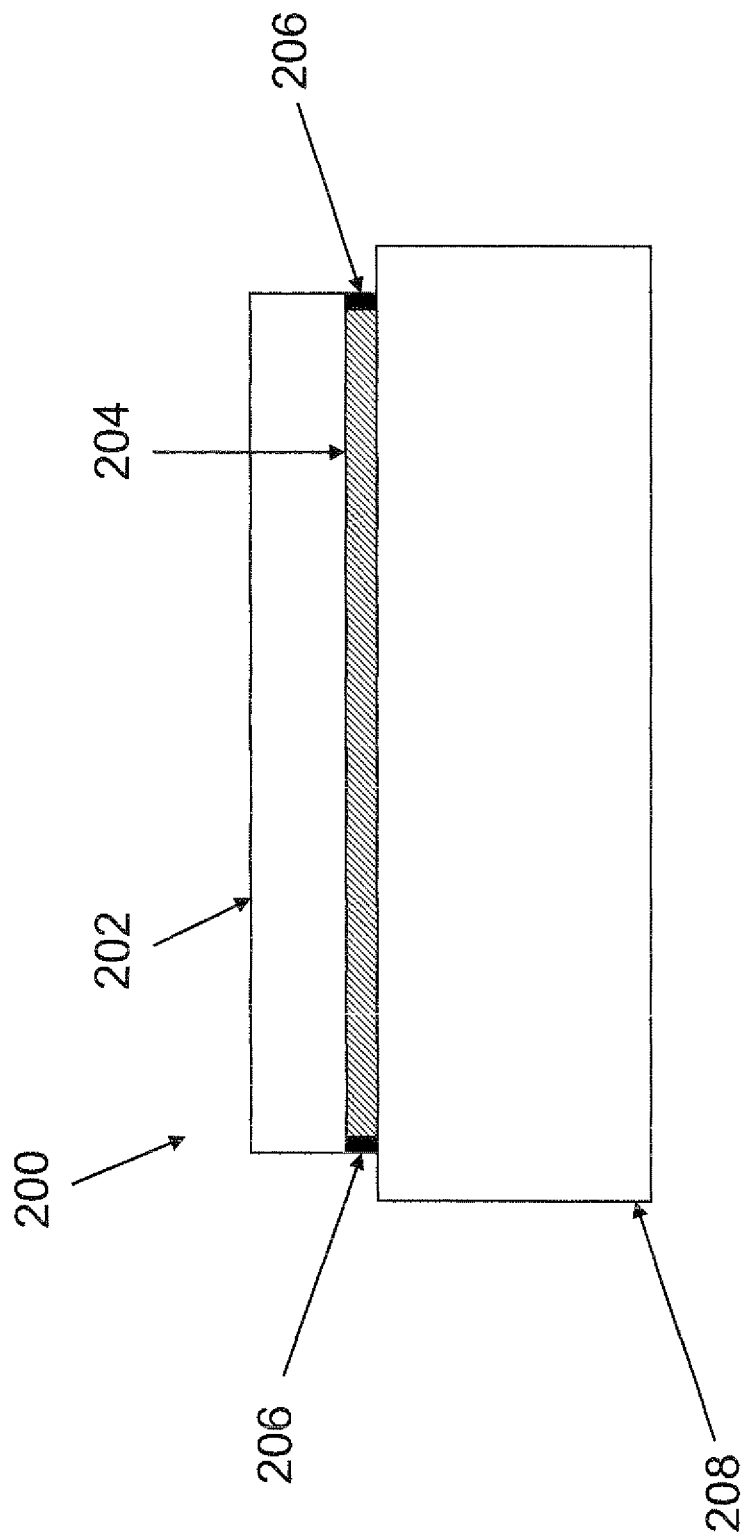
FIG. 3 is an illustrative cross-sectional view of the exemplary improved mirror of FIG. 2 after bonding has taken place in accordance with an example embodiment.

FIG. 2 is an illustrative cross-sectional view of an exemplary improved mirror in accordance with another example embodiment, and FIG. 3 is an illustrative cross-sectional view of the exemplary improved mirror of FIG. 2 after bonding has taken place in accordance with an example embodiment. Improved mirror 200 may have a first glass substrate 202 and a second glass substrate 208. A reflective coating 204 and a laminate 206 may be located between the two substrates 202 and 208. In this illustrative view the example embodiment is shown with the reflective coating 204 removed from the peripheral of the first glass substrate 202. Further, second glass substrate 208 may be dimensioned differently (e.g., have larger dimensions) than first glass substrate 202. As shown in FIG. 2, the first and second substrates 202 and 208 are substantially flat and are oriented in substantially parallel relation to one another.

Reflective coating 204 may be removed from (or not applied to) the edges of the first glass substrate 202. This may facilitate, for example, protection of the reflective coating 204 from the environment. As shown in the post-bonding view of FIG. 3, laminate 206 may form a seal around the outer edges of the first glass substrate 202. In the FIG. 3 example view, the laminate 206 is shown only at the periphery of the first substrate 202. However, in different embodiments, the laminate may be provided along substantially all of the first and/or second substrates 202 and 208 including, for example, at the peripheral edges thereof. In any event, the seal formed by laminate 206 may in certain example instances help seal the reflective coating from the outside environment. This may help to reduce the likelihood of the deterioration of the reflective coating (e.g., through oxidization, exposure to the outside environment, etc.).

In certain example embodiments the edge deletion of the reflective coating with respect to the outer edge of the first glass substrate may be between about 0.5 mm and 5 mm or more preferably between about 0.7 and 3 mm.

Figure 4:
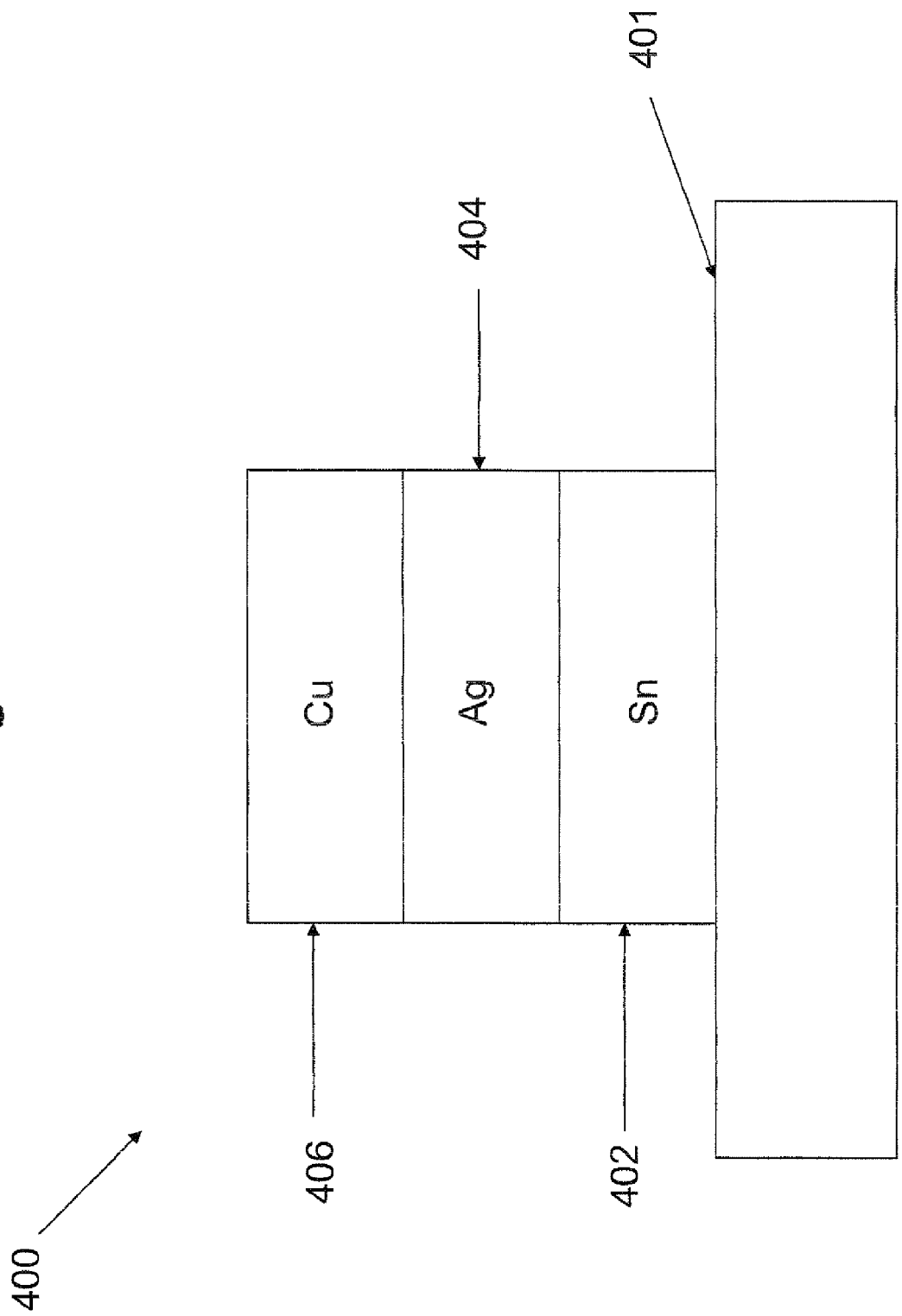
FIG. 4 is an illustrative cross-sectional view of an exemplary mirror coating stack in accordance with an example embodiment.

In certain example embodiments, the dimensions of the second glass substrate may be larger than the dimensions of the first glass substrate. This may, for example, facilitate the protection of the reflective coating 206 from the outside environment FIG. 4 is an illustrative cross-sectional view of an exemplary mirror coating, such as 204 in FIG. 2, in accordance with an example embodiment. The mirror coating is supported by a glass substrate 401. While silver may be a preferred material for its high reflectivity (between about 95% and 99% in most visible and infrared spectrums), additional materials may be applied in conjunction with silver. For instance, silver disposed (e.g., deposited) onto a glass substrate may not bond well with the underlying glass substrate. As such, tin (e.g., deposited or otherwise disposed using tin chloride) may be used to prepare the glass surface and to facilitate the bonding of the silver to the glass surface. Thus, in application, the first layer 402 of reflective coating 400 may include tin (e.g., tin chloride) to prepare the glass substrate for the second, middle layer 404. The middle layer may be silver or another reflective material (e.g., aluminum). A third layer 406 of copper and/or metal oxides may also be used to increase the durability of the reflective coating. The reflective layer 404 may be provided over and contacting the tin-inclusive layer 402 in certain example embodiments, and the Cu-based and/or metal oxides protective layer may be provided over and contacting the reflective layer 404 in certain example embodiments.

As the reflective coating is sealed between the two glass substrates after the laminate bonding process, the thickness of the Ag and Cu layers in certain embodiments may be around 1000 Å and 350 Å respectively. In other example embodiments the surface density of the silver layer may be around 80 mg/sqft to 95 mg/sqft, more preferably about 90 mg/sqft. Further, in certain example embodiments, as there may be no protective paint layer backing the reflective coating, the need for an increased silver thickness may be reduced (and sometimes even eliminated). Thus, the silver layer may be less than thick than is normally required in conventional mirrors for CSP applications. Thus, certain example embodiments may not include a layer of paint over the mirror coating.

Accordingly, certain example embodiments may result in an overall reflectivity rating of greater than 90%, more preferably greater than 93%, and sometimes even greater than or equal to 94.5%.

Figure 5:
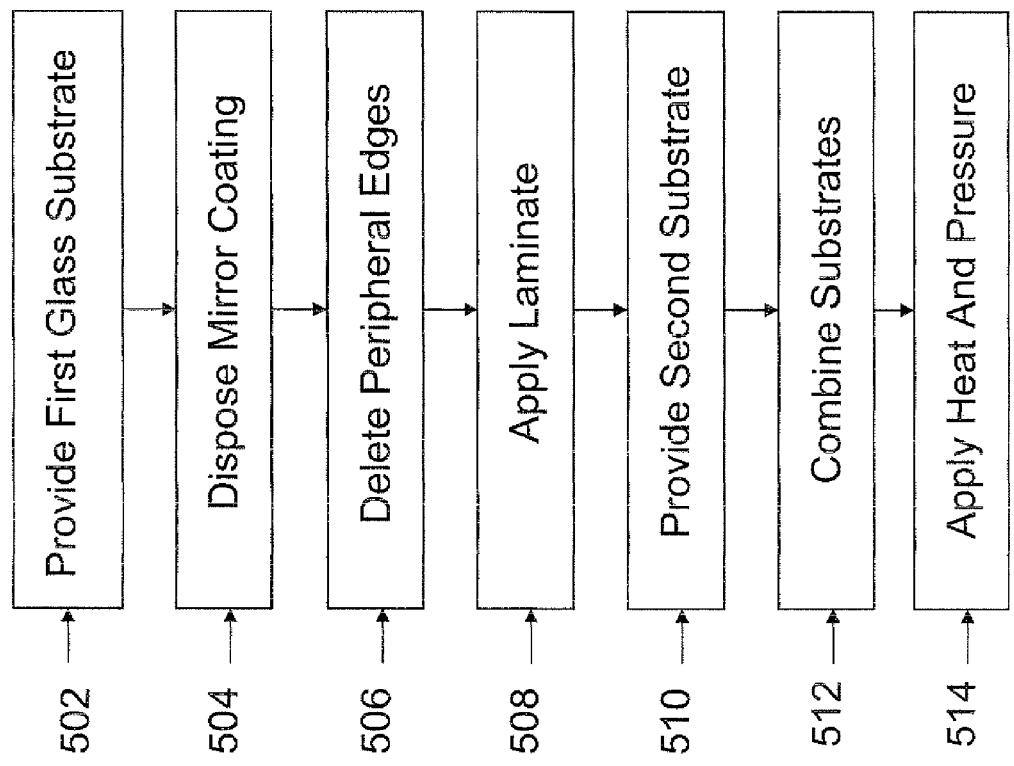
FIG. 5 is a flowchart of an illustrative process for making an exemplary improved mirror according to an example embodiment.

FIG. 5 is a flowchart of an illustrative process for making an exemplary improved mirror according to an example embodiment. In step 502, a first glass substrate is provided. As discussed above, the first glass substrate may be a low iron, high transmission piece of glass with a thickness, for example, of between around 1.5 mm and 1.6 mm. Once the first substrate is provided, in step 504 a mirror coating may be disposed (e.g., deposited) on an inner surface thereof. Various techniques for disposing the mirror coating may be used. For example, the tin layer may be applied to prepare the surface of the glass to receive the silver and copper layers. The silver and copper layers may be disposed (e.g., deposited) onto the first glass substrate by a disposition process such as sputtering or the like.

With the mirror coating in place, in step 506, the mirror coating may then be deleted from around the edges of the first glass substrate. It will be appreciated that deletion of the peripheral edges may instead be replaced by placing a mask over the inner surface of the glass substrate. A mask may, for example, be placed around the edges of the inner surface of the first glass substrate. After disposing a mirror coating, the mask may then be removed, leaving an uncoated area proximate to the edge.

In step 508, a laminate may be applied. Polyvinyl butyral (PVB), ethyl vinyl acetate (EVA), or the like, may be used in certain example embodiments. In certain example embodiments, the PVB thickness may range from 0.1-1.0 mm, more preferably 0.38 or 0.76 mm. In certain example embodiments, the particular laminate material may be formulated so to help provide for long term durability and good adhesion over time. Other laminates with similar adhesion strength, sealing, durability, and/or other qualities may also be used. For example, one-, two-, or more-part urethanes may be used in certain example embodiments. Adhesives (e.g., pressure sensitive adhesives) also may be used in certain example embodiments. In step 510, a second glass substrate may be provided. As discussed above the second, the back end, second glass substrate may be of a lower quality (e.g., lower transmission and/or higher iron) of glass. Once the 4 layers of the improved mirror are prepared (e.g., the first glass substrate, the mirror coating, the laminate, and the second glass substrate), the substrates may be combined in step 512 (e.g., oriented proximate to one another) and then subject to heat and pressure in step 514. The heat and/or pressure may facilitate the bonding of the two glass substrates through the laminate. Further, in certain example embodiments the heat and pressure may allow the laminate (e.g., PVB) to become optically clear. Of course, certain laminate materials may be cured by means other than heat and pressure such as, for example, UV curable materials.

Once bonded together, the two glass substrates with the mirror coating sandwiched therebetween may be structurally similar to a single piece of glass. Thus, the newly created mirror may be used in CSP applications or the like.

In certain example embodiments, the metal layers described above may be applied on the mirror line during the first pass. The PVB lamination may be performed by a conventional autoclave process on the lamination line using a pre-formed PVB sheet in a second pass. In some situations, this may result in an expensive two-pass process. Although this process may provide an excellent encapsulation to the metal layers, the cost of PVB material and the multiple passes required for production nonetheless may make this product less attractive compared to a conventional monolithic painted mirror in certain example embodiments.

Accordingly, in certain example embodiments, it may be advantageous to provide a cost-effective and/or single pass process of producing a laminated concentrated solar panel (mirror). This may be done, for example, by providing a liquid radiation curable laminating adhesive between the mirror-coated glass substrate and the backing glass substrate. This laminating adhesive, in certain embodiments, may be cured using UV radiation over a period of from about less than one second to several minutes, more preferably from about 1 to 60 seconds. This may advantageously bond the glass substrates together with good adhesive strength. In certain example embodiments, the UV irradiation photopolymerizes the liquid adhesive. Accordingly, a polymeric interlayer between the mirrored front glass substrate and the backing glass substrate is formed, in some instances.

Figure 6:
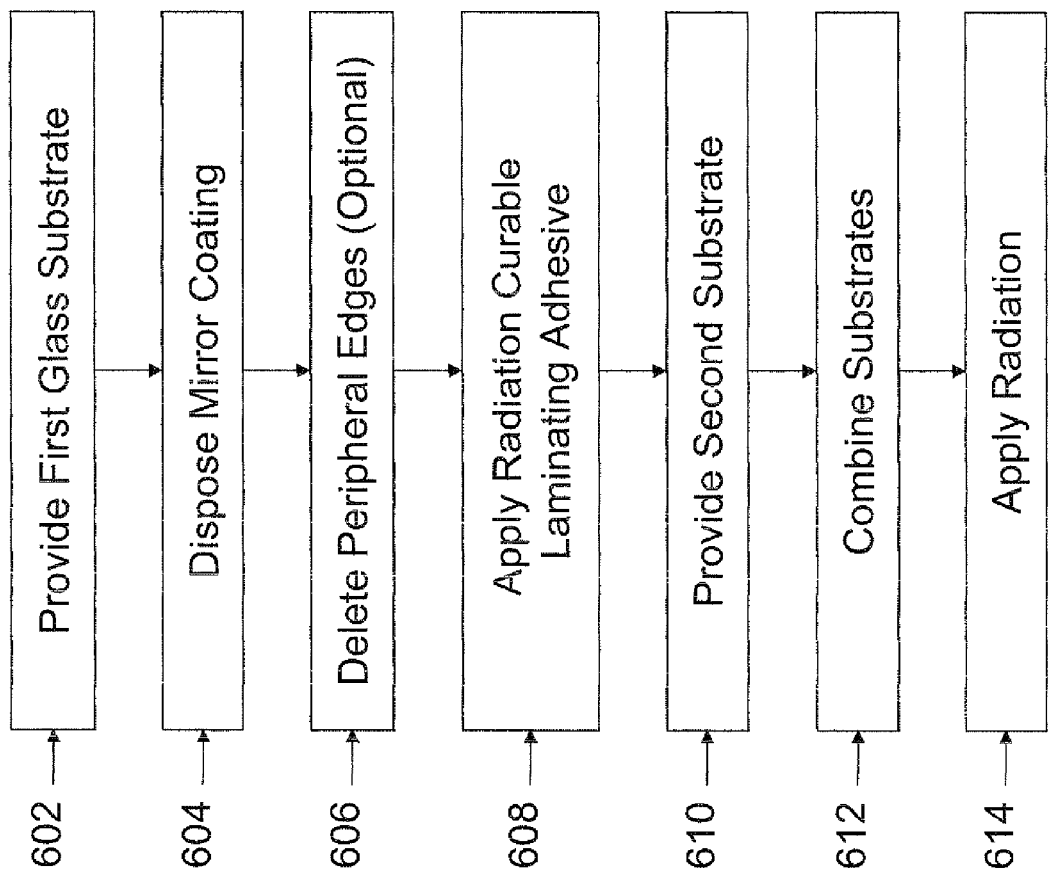
FIG. 6 is a flowchart of an illustrative process for making another exemplary improved mirror including a radiation curable laminating adhesive, according to an example embodiment.

FIG. 6 is a flowchart of an illustrative process for making an exemplary improved mirror according to another example embodiment, wherein a reflective laminated mirror (e.g., a reflective article) is produced using a UV curable laminating adhesive. In step 602, a first glass substrate is provided. As discussed above, the first glass substrate may be a low iron, high transmission piece of glass with a thickness, for example, of between around 1.5 mm and 1.6 mm. Once the first substrate is provided, in step 604 a mirror coating may be disposed (e.g., deposited) on an inner surface thereof. Various techniques for disposing the mirror coating may be used. For example, the tin layer may be applied to prepare the surface of the glass to receive the silver and copper layers. The silver and copper layers may be disposed (e.g., deposited) onto the first glass substrate by a disposition process such as sputtering or the like.

With the mirror coating in place, in step 606, the mirror coating may then be deleted from around the edges of the first glass substrate. It will be appreciated that deletion of the peripheral edges may instead be replaced by placing a mask over the inner surface of the glass substrate. A mask may, for example, be placed around the edges of the inner surface of the first glass substrate. After disposing a mirror coating, the mask may then be removed, leaving an uncoated area proximate to the edge. Step 606 is optional.

In step 608, a laminate may be applied. In certain example embodiments, step 608 may represent a cost effective and/or single pass process for producing a laminated mirror/concentrated solar panel. In certain example embodiments, in step 608, a liquid radiation curable laminating adhesive may be applied to the mirror coated glass substrate, such that the laminating adhesive may ultimately be encapsulated between the mirror coated glass substrate and the backing glass substrate. The radiation curable (e.g., UV curable) adhesive may be of or comprise oligomers, monomers, adhesion promoter(s) and/or a photoinitiator and/or polymerization initiator. In some instances, the "cure dynamics" of these adhesives may depend on the types of UV lamp(s) and/or photoinitiator(s).

In certain example embodiments, photo-initiators that can form free-radicals at longer wavelengths (e.g., greater than or equal to 340 nm) of UV radiation/irradiation may be used. This may be advantageous in situations where, for example, the front or backing glass substrate(s) blocks shorter UV wavelengths. In certain exemplary embodiments, the photoinitiator may be designed such that its maximum UV absorption is from about 340 to 430 nm, more preferably from about 350 to 420 nm, and most preferably from about 350 to 390 nm (e.g., above the wavelength of UV absorption of the backing glass). In other examples, the maximum UV absorption may be from about 390 to 420 nm. In certain example embodiments, these photoinitiators may be commercially available from Ciba Specialties (e.g., Irgacure 819 and/or 2022), although other photoinitiators are of course usable in connection with different embodiments of this invention.

In certain exemplary embodiments, the oligomers in the radiation curable adhesive may comprise aliphatic urethane acrylate (diacrylate and/or monoacrylate) resins with higher molecular weight and lower glass transition temperature. In certain example embodiments, this may advantageously provide good elongation, flexibility, adhesion, and/or high temperature resistance. In different example embodiments, these resins may have different types of backbones (e.g., polyether and/or polyester). Example embodiments of monomers used may include mono functional acrylates, which may advantageously minimize shrinkage upon curing, in certain cases.

In certain example embodiments, the laminating adhesive may comprise (by weight):

TABLE 4

| Material | Preferred | More Preferred | Example |
|---|---|---|---|
| Laminating Adhesive Oligomer (e.g., CN136) | 75-99% | 86-96% | 91% |
| Urethane Acrylate Oligomer (e.g., CN966H90) | 0-15% | 1-11% | 6% |
| Total Oligomer | 60-99.5% | 85-99% | 97% |
| Adhesion Promoters | 0-5% | 1-5% | 2.5% |
| Photoinitiator | 0-5% | 0.001-1% | 0.50% |

In certain example embodiments, a radiation curable adhesive may be advantageous in that the final cured polymer interlayer (which, of course, depends on the oligomer(s) and/or monomer(s) selection) is not necessarily clear and transparent. Although the layer may be transparent in some embodiments, in other embodiments it may be advantageous to have an interlayer that appears hazy or satin/sateen to hide the copper layer from the back side, e.g., for aesthetic of other purposes. In further embodiments, a polymer interlayer with reflective color(s) may be advantageous.

In certain example embodiments, the radiation cured polymer interlayer may have a thickness ranging from 0.01-1.0 mm, more preferably from about 0.08 to 0.51, and most preferably from about 0.15 or 0.18 min. In certain example embodiments, the particular laminate material may be formulated so to help provide for long term durability and good adhesion over time. Other laminates with similar adhesion strength, sealing, durability, and/or other qualities may also be used. For example, one-, two-, or more-part urethanes may be used in certain example embodiments.

In step 610, a second glass substrate may be provided. As discussed above the second, the back end glass substrate may be of a lower quality (e.g., lower transmission and/or higher iron) glass. Once the layers of the improved mirror are prepared (e.g., the first glass substrate, the mirror coating, the radiation curable laminating adhesive, and the second glass substrate), the substrates may be combined in step 612 (e.g., oriented proximate to one another) and then subject to heat, pressure and/or radiation in step 614. The heat and/or pressure may facilitate the bonding of the two glass substrates through the laminate. Furthermore, certain laminate materials may be cured by means other than heat and pressure; for example, by radiation.

In certain example embodiments, in step 614, the combined substrates may be subjected to UV radiation from UV curing equipment. In certain instances, the UV radiation may include a spectrum of wavelengths from about 180 to 460 nm. This radiation may be obtained from the discharge of a mercury vapor and/or xenon lamp in certain embodiments. Various lamps may emit different wavelengths of UV light and may cause and/or influence the free radical formation of the photoinitiator. In certain exemplary embodiments, the spectral output of the lamps may be in the longer UV wavelength range, because the glass may absorb shorter wavelengths, as described above. For example, the UV wavelength range from the lamp(s) may be from about 300 to 450 nm, more preferably from about 340 to 430 nm, and most preferably from about 350 to 420 nm (and in some cases from about 350 to 390 nm). Wavelengths of from about 390 to 420 nm may be used in other example embodiments.

In certain example embodiments, the lamps used for curing the laminating adhesive may include one or more V-bulb(s) (gallium filled bulb) and/or D-bulb(s) (iron additive in the mercury lamp). In certain examples, the spectral output of the V-bulb is near the upper end of the spectrum (e.g., from about 390 to 420 nm). The spectral output of the D-bulb is dominant in the 340 to 430 nm range, with the strongest UV energy in the 350 to 380 nm range, in some cases. The H-bulb (medium pressure mercury lam) has a few peaks in the 370-400 nm range, and may be suitable in certain instances despite much of its spectral distribution in the shorter UV wavelength range (e.g., 210 to 320 nm). The H-bulb may work particularly well when used with photoinitiator(s) that can produce free radicals effectively at or near 370 nm.

EXAMPLE

The metalized front glass (reflective part of the laminate) was prepared using a conventional mirror process. An 8"×8" low-iron glass (1.6 mm) was washed and sensitized by a tin chloride spray. Next, a silver layer (typically about 70 nm in thickness), a reflective portion of the mirror, was applied via spraying, followed by the passivating metallic copper film. This layer was formed by precipitating copper from a solution of one of its salts. The metal coating along the edges of the mirror was removed (about 1 cm) to minimize the exposure of the metals to the outside environment.

The radiation curable adhesives typically contain reactive oligomers, reactive diluents (monomers), adhesion promoters, and photoinitiators. The adhesive that was used in this example was obtained from Sartomer USA. This adhesive contains an aliphatic urethane diacrylate, a mono-functional monomer and a low concentration of photoinitiator such as TPO, which is commercially available from Ciba Specialties.

A predetermined amount of this adhesive was placed onto the silver/copper coated side of the front glass substrate and the backing glass (2.3 mm) was placed on top of the liquid and pressed down to distribute the liquid evenly on the glass. This sandwich was passed through laboratory UV curing equipment that contains V and D bulbs and is cured by UV radiation at 20 fpm. The output of these lamps is 600 watts/inch, and the measured dosage at this line speed is approximately 2900 mJ/cm$^2$. After exposing the above-mentioned sandwich to the UV irradiation, the adhesive was solidified because of the photo-polymerization. The reflective front glass and the supporting backing glass were found to be strongly bonded together. The adhesive thickness is approximately 6-7 mils after curing (e.g., 0.15 to 0.18 mm). However, samples with other thicknesses (e.g., from about 3 to 20 mils, or from about 0.08 to 0.51 mm) were also produced. Some of these examples were characterized on Perkin Elmer, and the samples yielded approximately 94.4% to 94.5% reflectivity (ISO 9050).

Laminate tests including a bake test and a boil test were conducted on these samples and no degradation was observed. These samples were placed in the environmental chambers (85° C./85% RH, Humidity Freeze) and no signs of structural or reflectivity degradation were observed after 1000 hours of exposure.

The boil test included collecting 12" by 12" test samples of the product to be tested, and submerging them in boiling water for at least two hours. The samples were placed vertically in a boil tank, and were fully submerged in the water. The water level was maintained above the edge of the sample throughout the test period. The water was boiled (at 220 degrees F.), and the sample(s) remained in boiling water for two hours. When the test was complete, the sample(s) was/were checked for separation and/or air bubbling in accordance with American National Standards Institute Z26.1, section 5.4.3. No bubbles shall develop more than ½" from the edge of the specimen. As indicated above, the samples passed this boil test.

Although specific output powers have been identified above, it will be appreciated that the output powers, dosages, and line speeds may vary when different UV sources are implemented. For the above-described example, for instance, these values may vary +/−25%, more preferably +/−20%, and still more preferably +/−10-15%, for the values indicated above. Furthermore, although certain UV wavelengths are disclosed herein, it will be appreciated that the materials in the laminating material may be modified and, as such, different wavelengths of radiation may be used for curing in different example embodiments.

It will be appreciated that the steps may be performed in various orders and/or certain steps may not be performed at all in different embodiments of this invention. For example, the second glass substrate may be provided in combination with a laminate and/or the deletion of the mirror coating may be performed by using a mask.

It will be appreciated by those skilled in the art that the use of glass substrates with two different compositions may result in the glass substrates having different heating coefficients. For example, the first glass substrate may have a relatively low iron percentage when compared to that of the second glass substrate. As the second glass substrate may have a higher iron count, it may heat up more rapidly than the first glass substrate (e.g., as a result of the iron absorbing more heat). Furthermore, as the second glass substrate has a mirror in front of it the heat transferred through the first glass substrate to the mirror may or may not be passed on to the second glass substrate. Accordingly, the rate of thermal expansion for the first and second glass substrates may be different. It will be appreciated, however, that when the rate of thermal expansion for two laminated materials is different, the laminate may not hold, as the two materials expand and contract at different rates. Thus, identification of a correct heating profile for the laminate for the two materials may be desired. The CTE difference may be of interest, e.g., when infrared (IR) heating is used and/or IR exposure is encountered, given the different IR absorption rates implied by the different iron contents.

One way of approaching this problem is to adjust the amount of heat, UV radiation, and/or type of UV radiation directed at either or both of the two materials. For example, under "normal" conditions, if the first glass substrate is heating slower than the second glass substrate, techniques may be used that either add heat to the first glass substrate or remove it from the second glass substrate (e.g., through a heat sink). Thus, the first (e.g., low iron) substrate may be preferentially heated in certain example embodiments so as to account for the difference in heating coefficient with respect to the second substrate. A heating profile of the assembly may be developed and optimized in certain example instances, e.g., so as to help ensure that the substrates are appropriately laminated to one another. An example heating profile may take into account the different glass compositions, the presence of the mirror coating on one of the substrates, etc.

Although the heat associated with UV radiation in certain cases may not be substantial and thus may not need to be compensated for, in other cases, it may be advantageous to take the compositions of the glass substrates into consideration when curing the adhesive, e.g., because of differences in absorption of the UV radiation caused by different substrate materials. Thus, certain example embodiments may involve glass substrates with different compositions being subject to different wavelengths of UV radiation and/or different types of UV sources (e.g., UV bulbs). In other examples, the UV sources may be provided on the side of one of the glass substrates, but not the other. In still other cases, the same or different UV sources may be provided on both sides of the substrate and controlled in the same or different manners (e.g., in terms of timing, intensity, etc.) to address differences in the glass substrate compositions.

A further embodiment may, for example, include a "dual-cured" UV-curable laminating adhesive. In these embodiments, both heat and UV curing may be used to cure the laminate. In certain examples, heat may be used first to partially cure the adhesive (e.g., to set the liquid), and then the coating may be exposed to UV in order to complete the curing. In other example embodiments, heating and UV curing may be used simultaneously, in part or in full. Furthermore, the UV curing may precede the heating in certain example embodiments. The heat used in the first or initial step may be relatively low, since it is used for setting or initial partial drying and/or curing, and the overall heat may be kept low because of the subsequent low-heat UV process.

Although certain example embodiments have been described as relating to flat, laminated CSP applications, the example embodiments described herein may also be applied to bent (e.g., whether hot bent or cold-bent) mirrors. Furthermore, although certain example embodiments have described a multi-layer mirror coating, different layers may be provided in place of or in addition to the above-described layers in different embodiments. In certain example embodiments, a single reflective layer may be provided. In certain example embodiments, the reflective layer need not be a thin film layer. In addition, or in the alternative, the mirror layer(s) may be located on different surfaces in different embodiments of this invention. Thus, while certain example embodiments herein have been applied to flat glass substrates, it will be appreciated that the above techniques may also be applied to curved glass substrates. Other applications also are possible including, for example, secondary reflector panel (SRP) applications. Furthermore, incident light need not be focused on a tower. In other CSP or CPV applications, for example, light may be focused on a tube with a heatable liquid, etc.

Furthermore, although certain example embodiments have been described as including two substrates (e.g., a substrate supporting a mirror coating and a backing substrate, or vice versa), certain example embodiments may include only one substrate supporting a mirror coating and an encapsulating coating, which may be prepared based on the UV-curable adhesives disclosed herein.

As used herein, the terms "peripheral" and "edge" may not mean that the laminate seals are located at the absolute periphery or edge of the glass substrates, but instead mean that the laminate may at least be partially located at or near (e.g., within about 2 mm of) an edge of at least one glass substrate of the mirror. Likewise, "edge" as used herein is not limited to the absolute edge of a glass substrate or coating but also may include an area at or near (e.g., within about 2 mm of) an absolute edge of the substrate(s) or coating.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making an article, the method comprising:
providing a first low-iron glass substrate, the first substrate having a thickness of about 0.5-3 mm;
disposing a reflective coating on a major surface of the first substrate;
disposing a UV radiation curable laminating adhesive over the reflective coating, wherein the laminating adhesive comprises from about 80 to 99.5% total oligomer, from about 1 to 5% adhesion promoter, and from about 0.1 to 1% photoinitiator;
providing a second glass substrate substantially parallel to the first substrate, the second substrate being oriented over the UV radiation curable laminating adhesive;
irradiating the substrates such that UV radiation causes the adhesive to become a solid polymer interlayer to laminate together the first substrate with the reflective coating disposed thereon and the second substrate to form a reflective article, wherein the laminating adhesive is cured using said UV radiation at a wavelength of from about 340 to 430 nm,
wherein the reflective article has a reflectivity of at least 90 percent.

2. The method of claim 1, wherein the thickness of the first substrate is about 1.6 mm.

3. The method of claim 1, wherein the laminating adhesive is cured using said UV radiation at a wavelength of from about 350 to 420 nm.

4. The method of claim 1, wherein the laminating adhesive is cured using said UV radiation at a wavelength of from about 350 to 390 nm.

5. The method of claim 1, wherein the laminating adhesive is cured using said UV radiation at a wavelength of from about 390 to 420 nm.

6. The method of claim 5, wherein the second substrate includes more iron than the first substrate.

7. The method of claim 1, wherein the total oligomer comprises aliphatic urethane acrylate resins.

8. The method of claim 1, wherein the photoinitiator has maximum UV absorption at from about 350 to 390 nm.

9. The method of claim 1, wherein the polymer interlayer appears at least one of hazy and sateen following said irradiating.

10. The method of claim 1, further comprising deleting 0.5-5 mm of the reflective coating from around a periphery of the first substrate.

11. The method of claim 1, wherein the polymer interlayer has a thickness from about 0.1-1.0 mm after said irradiating.

12. The method of claim 1, wherein the second substrate is at least twice as thick as the first substrate.

13. The method of claim 1, wherein the second substrate includes a major surface area that is larger than a major surface area of the first substrate.

14. The method of claim 1, wherein the reflective coating comprises a plurality of thin film layers including a silver-based layer and a copper-based layer over and contacting the silver-based layer.

15. The method of claim 14, wherein the reflective coating further comprises a tin-inclusive layer, the tin-inclusive layer being interposed between and contacting both the first substrate and the silver-based layer.

16. The method of claim 15, wherein the silver-based layer is from about 80 mg per square foot to 95 mg per square foot.

17. The method of claim 1, wherein the laminating together of the first and second substrates hermetically seals the reflective coating between the first and second substrates.

18. The method of claim 1, wherein the polymer interlayer appears hazy following said irradiating.

19. The method of claim 1, wherein the polymer interlayer appears sateen following said irradiating.

* * * * *